United States Patent [19]

Vook et al.

[11] Patent Number: 5,420,454
[45] Date of Patent: May 30, 1995

[54] SELECTIVE EPITAXIAL SILICON FOR INTRINSIC-EXTRINSIC BASE LINK

[76] Inventors: Dietrich W. Vook, 736 Fremont St., Apt. 3, Menlo Park, Calif. 94025; Hsin H. Wang, 6288 Goddess Ct., San Jose, Calif. 95129

[21] Appl. No.: 269,992

[22] Filed: Jul. 1, 1994

Related U.S. Application Data

[63] Continuation of Ser. No. 984,813, Dec. 3, 1992, abandoned.

[51] Int. Cl.⁶ .......................................... H01L 29/72
[52] U.S. Cl. .................................. 257/518; 257/554; 257/571; 257/588; 257/592; 257/754
[58] Field of Search .............. 257/592, 518, 554, 571, 257/588, 754

[56] References Cited

U.S. PATENT DOCUMENTS

| | | | |
|---|---|---|---|
| 5,096,844 | 3/1992 | König et al. | 257/592 |
| 5,235,206 | 8/1993 | Desilets et al. | 257/578 |

OTHER PUBLICATIONS

S. Chiang, D. Pettengill, P. Vande Voorde, *Bipolar Device Design for Circuit Performance Optimization,* IEEE 1990 Bipolar Circuits and Technology Meeting (1990).

W. Huang, C. Drowley, P. Vande Voorde, D. Pettengill, J. Turner, A. Kapoor, C. Lin, G. Burton, S. Rosner, K. Brigham, H. Fu, S. Oh, M. Scott, S. Chaing, A. Wang, *A High–Speed Bipolar Technolgy Featuring Self–Aligned Single–Poly Base and Submicrometer Emitter Contacts,* IEEE Electron Device Letters, vol. 11, No. 9 (Sep. 1990).

J. Hayden, J. Burnett, J. Pfiester, M. Woo, *An Ultra–Shallow Link Base for a Double Polysilicon Bipolar Transistor,* IEEE 1990 Bipolar Circuits and Technology Meeting (1992).

*Primary Examiner*—Edward Wojciehowicz

[57] ABSTRACT

In a bipolar device, selective epitaxial silicon provides an improved intrinsic-extrinsic base link. A trench physically separates an intrinsic and extrinsic base portion. The trench includes sidewalls having a thin oxide layer formed thereon. The bottom of the trench is exposed during processing. A shallow link between the intrinsic-extrinsic regions of a bipolar transistor base is formed by depositing a heavily boron doped layer of silicon on the exposed portion of the trench. During subsequent processing, including rapid thermal anneal, there is some boron out-diffusion which forms a shallow diffused intrinsic-extrinsic base link.

4 Claims, 2 Drawing Sheets

SELECTIVE EPITAXIAL SILICON FOR INTRINSIC-EXTRINSIC BASE LINK

CROSS REFERENCE TO RELATED APPLICATIONS(s)

This is continuation of application Ser. No. 07/984,813, filed on Dec. 3, 1992, now abandoned.

BACKGROUND OF THE INVENTION

1. Technical Field

The present invention relates to semiconductor devices. More particularly, the present invention relates to the fabrication of silicon bipolar junction transistors.

2. Description of the Prior Art

Rapid progress has been made in improving silicon bipolar transistor technology in recent years. As a result of such improvement, silicon bipolar junction transistors are widely used for various circuit applications. Some of the areas in which these improvements have been made include, for example, reduced line width lithography, lateral transistor scaling, defect density reduction, and advances in silicon integrated circuit technology, such as multilevel interconnect. Accordingly, it is not unusual for bipolar device integration levels to reach 100 k gates/chip.

At the same time, advances in bipolar device technology have permitted vertical, as well as lateral, device scaling and reductions in parasitics that have pushed minimum gate delays down to 20 ps (unloaded) and transistor gain up to 52 GHz. See, for example, S. Chiang, D. Pettengill, P. Vande Vorrde, *Bipolar Device Design For Circuit Performance Optimization*, IEEE 1990 Bipolar Circuits and Technology Meeting.

A bipolar transistor is an active device having three elements: an emitter, a collector, and a base. The structural inter-relation of these elements in an integrated circuit is shown in FIG. 1, in which a bipolar transistor 10 is shown in cross section as part of an integrated circuit. The structure shown is a typical NPN-type device in which the emitter 16 and collector 12 have an N-type doping and the gate 14 has a P-type doping. It should be appreciated that bipolar transistors may be formed in many different ways, such that the appearance of some bipolar transistors may not exactly match that shown in FIG. 1. For example, in a PNP device, the emitter and collector have a P-type doping and the base has an N-type doping.

In FIG. 1, an NPN bipolar transistor 10 is shown having a collector 12 and an emitter 16. A base 14 is formed between the collector and the emitter. In applications requiring a fast transit time it is desirable to have a narrow base. Therefore, the base typically includes an active portion, referred to as the intrinsic region 17, and a portion that serves to connect the intrinsic base to a metal interconnect system, referred to as the extrinsic region 15. The bipolar transistor structure is represented schematically in FIG. 1a.

Bipolar transistors are attractive design elements because of their high speed. One characteristic measure of this speed is the transit time ("$\tau_{EC}$") across the base. A dominant portion of $\tau_{EC}$ is $\tau_B$, the base transit time. Thus, it is common practice to taper the base at the intrinsic region such that the width of the base $W_B$ is much narrower than the extrinsic base region. This tapering is shown in FIG. 1. Tapering the base, while initially improving device speed, has been found to increase resistance across the base. Thus, the extrinsic base region is usually designed with a lower resistance than the intrinsic base region, i.e. $R_{BX} < R_{BI}$. One way of viewing this phenomenon is by analogy to a water pipe. A narrower pipe passes less water than a wider pipe in the same amount of time and therefore offers more resistance to the flow of water.

It is therefore desirable, for reasons of speed and performance, to have both $W_B$ and $R_{BX}$ small. This implies the need to provide a high level of doping in the extrinsic base region, which can lead to two problems. If an extrinsic-intrinsic base link is provided that is too shallow, then contact to the intrinsic region is poor or non-existent, or the high doping in that region gives a very leaky emitter-base diode that reduces $\beta$, current gain, and degrades emitter-base ("EB") diode characteristics. If the extrinsic-intrinsic base link is too deep, the capacitance between the collector and the base ("$C_{CB}$") is increased and breakdown voltage is decreased. Also, the effect upon transit time $\tau_{EC}$ across the base of the transistor increases because the intrinsic base is effectively wide (and slow) at the emitter edge. The transit time $\tau_{EC}$ is also increased by capacitive terms as the extrinsic base or link doping level is increased.

Various techniques for making an electrical connection from an extrinsic base region to a narrow intrinsic base region in a bipolar transistor have been described in the art. Self alignment schemes for emitter-base structures have been suggested as a partial solution to the problem of fabricating low resistance intrinsic base structures in bipolar transistors. For example, it has been proposed to use an ultra-shallow link base in a double polysilicon transistor. See J. D. Hayden, J. D. Burnett, J. R. Pfester, M. P. Woo, *An Ultra-Shallow Link Base for a Double Polysilicon Bipolar Transistor*, IEEE 1992 Bipolar Circuits and Technology Meeting. In the technique described in the above paper, boron is diffused through a thin oxide. This leads to control problems because the link profile is strongly affected by the oxide thickness which cannot be well controlled.

It has also been suggested that the intrinsic-extrinsic base structure could be optimized by the use of ion implantation. However, it is difficult to scale an ion implant to a shallower depth to minimize intrinsic base region thickness $W_B$. At lower energies, much of the implant is lost in the screen oxide typically used to reduce stray contaminants. As the total concentration implanted (at lower energy) is increased to compensate for the fraction lost, a similar "active" profile is produced. A very low implant dose ("integrated concentration") is also necessary to achieve a shallow implant depth, such that the resulting base structure exhibits the emitter-base profile necessary for improved device performance. A dose low enough to provide a shallow implant profile would necessarily be so low that it would cause a high link resistance (high $R_{BX}$). Thus, the available range of implant profile depth does not scale with a reduction in implant energy.

Vapor phase doping is another approach suggested for achieving a shallower base structure. However, such approach produces an undesirable variability in the dose due to variations in native surface oxide which control the depth of diffusion.

The problem of optimizing bipolar transistor structures for speed by improving base characteristics has been difficult to solve. Most approaches to fabricating bipolar transistors have accepted the limitations imposed by known intrinsic-extrinsic base link structures.

However, it is not only difficult to use such known approaches to produce faster devices, but as device features become smaller and smaller, it becomes increasingly difficult to produce a scalable intrinsic-extrinsic base structure. As a result, device density is limited by the present state of the art. Thus, there is presently no way to optimize bipolar transistor intrinsic-extrinsic base structures for maximum speed and/or minimum size.

SUMMARY OF THE INVENTION

The present invention provides a silicon bipolar junction transistor structure in which selective epitaxial silicon is used to provide an intrinsic-extrinsic base link.

In the preferred embodiment of the invention, a shallow link between the intrinsic-extrinsic regions of a bipolar transistor base is formed by depositing a heavily boron doped layer of silicon on an exposed portion of a trench that separates the intrinsic base from the extrinsic base. The trench includes sidewalls having a thin oxide layer formed thereon. After deposition of boron doped silicon, there is some boron out-diffusion which forms an additional shallow diffused intrinsic-extrinsic base link.

The present invention improves bipolar device speed by providing a shallow link between the intrinsic base and the deeper heavily doped extrinsic base, while maintaining a minimum effective base width. The resulting selective epitaxial link also allows scaling of the link portion of the bipolar device as the rest of the device is scaled down to smaller sizes, thereby permitting smaller device geometry, denser device structures, and improved device speeds.

DETAILED DESCRIPTION OF THE INVENTION

Figure 1:
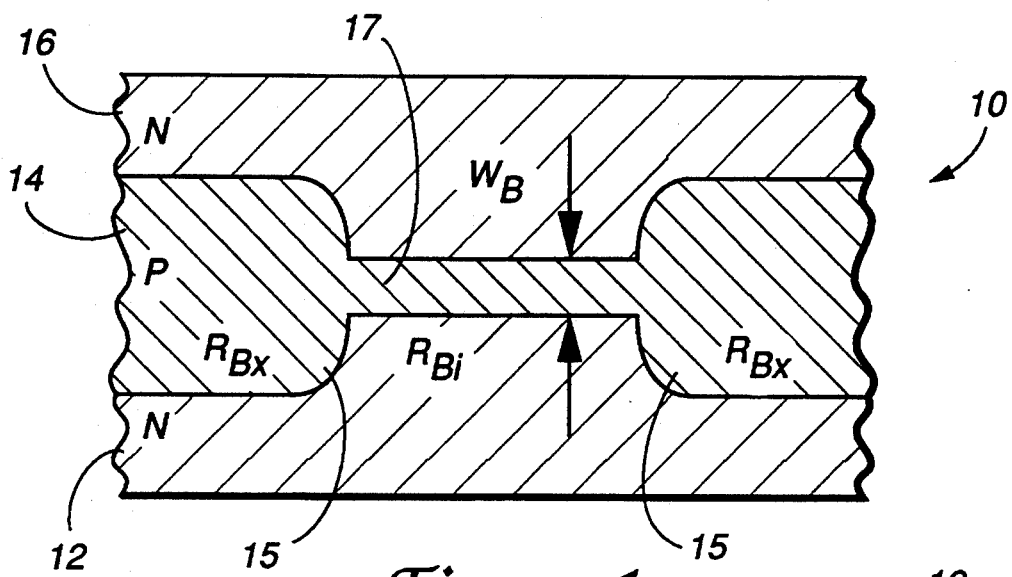
FIGS. 1 and 1a are schematic cross section of a prior art NPN bipolar transistor structure.
Figure 1A:
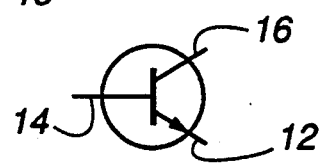

The present invention is best understood by referring to the Drawings in connection with review of this Description.

The present invention provides a shallow intrinsic-extrinsic base link in a bipolar transistor structure. The shallow link avoids the problems attendant with deep implants or diffusions, which reduce the speed of the device by producing parasitic transistor structures having a wide (and therefore slow) base region.

The present invention also provides a robust connection between the emitter and the base that is relatively insensitive to variations in thickness in the selective epitaxial material used by the invention to form the connection. Surface oxides are removed and suppressed by the selective epitaxial process. Thus, the present invention is not affected by thin surface oxides which would block a vapor phase doping link.

The present invention also provides a heavily doped polysilicon layer to reduce the resistance of the diffused link region, while maintaining a shallow vertical profile. This arrangement produces a very fast device.

A self-aligned trench-isolated polysilicon electrode ("STRIPE") etch process is used to form bipolar transistors in accordance with the present invention. In this process a single layer of polysilicon is used for both the base and emitter contacts. See, for example, W. M. Huang, C. I. Drowley, P. J. Vande Voorde, D. Pettengill, J. E. Turner, A. K. Kapoor, C.-H. Lin, G. Burton, S. J. Rosner, K. Brigham, H.-S. Fu, S.-Y. Oh, M. P. Scott, S.-Y. Chiang, and A. Wang, *A High-speed Bipolar Technology Featuring Self-Aligned Single-Poly Base and Submicrometer Emitter Contacts*, IEEE Electron Device Letters, Vol. 11, No. 9 (September 1990), the teaching of which is incorporated herein by this reference.

A bipolar transistor fabricated in accordance with the STRIPE process, referenced above, produces a structure having self-aligned base/emitter contacts formed using one polysilicon layer, but having geometry and frequency performance comparable to double polysilicon structures. It should be appreciated that the present invention is applicable to various bipolar structures and geometry, the structure set forth herein representing the preferred embodiment of the invention at this time. Thus, the present invention is applicable, for example, to bipolar structures having more than one polysilicon layer.

Figure 2:
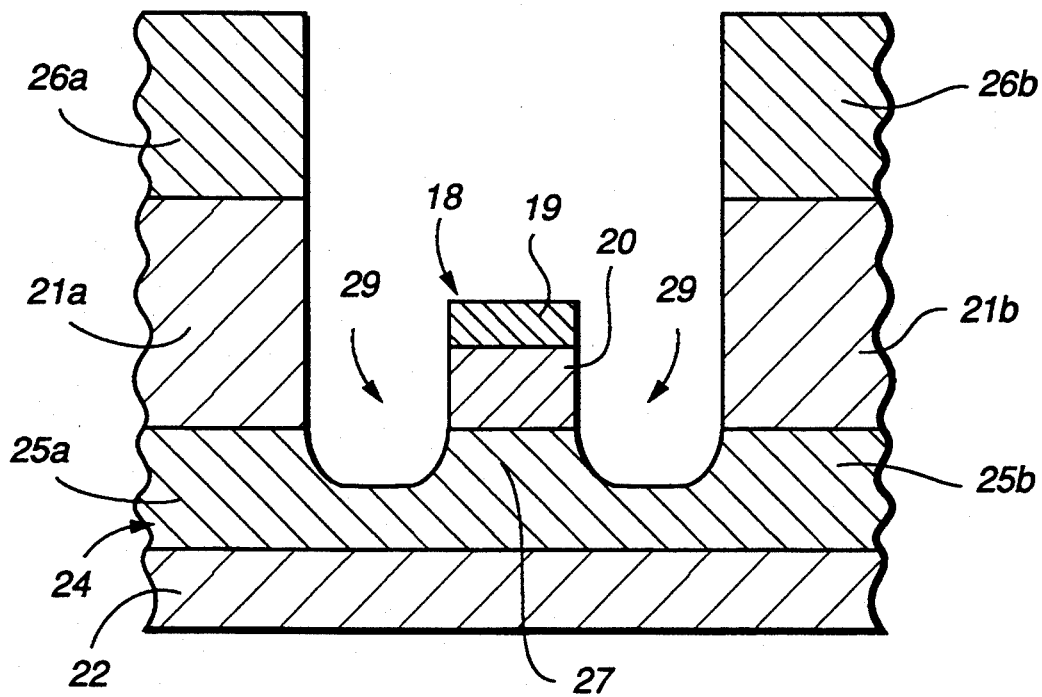
FIG. 2 is a schematic cross section of a bipolar transistor structure prior to deposition of a selective epitaxial intrinsic-extrinsic base link according to the present invention.

FIG. 2 is a schematic cross section of a bipolar transistor structure prior to deposition of the selective epitaxial intrinsic-extrinsic base link of the present invention. In FIG. 2, a bipolar transistor structure is shown that includes a collector 22; a base 24, including a diffused extrinsic base regions 25a/25b and a diffused intrinsic base region 27; an emitter 18, including an emitter polysilicon layer 20 and an oxide layer 19; an extrinsic base polysilicon layer 21a/21b; and a TEOS ($SiO_2$) layer 26a/26b. The extrinsic base polysilicon layer 21a/21b is isolated from the emitter polysilicon layer 20 by a trench 29.

In the preferred embodiment of the invention, NPN bipolar transistors are fabricated on a submicrometer 0.25-$\Omega$* cm N-type epitaxial layer, grown on an arsenic-doped buried layer P-type substrate. Active device islands are defined using bird's beak free isolation. After island formation, a phosphorus collector implant is performed on the collector island for reduced Kirk effect. The polysilicon layer that is used for both the emitter and base contacts is then deposited. The polysilicon layer is implanted with $BF_2$, and a thin silicon nitride layer is deposited. Boron is subsequently diffused from the polysilicon to provide the intrinsic base. The nitride and polysilicon are then patterned to define the overall transistor area. A CVD oxide layer is then deposited.

Self-aligned trench-isolated polysilicon electrodes are defined by masking and etching a window in the CVD oxide over the collector and emitter regions of the device. The oxide etch step is terminated in the underlying thin nitride. Nitride spacers are then formed at the window edges. The exposed polysilicon at the center of the window is oxidized.

The spacers are removed, and the exposed polysilicon at the window edges is etched through to the substrate using a reactive ion etch. The etch is controlled using a laser endpoint from a pattern over field oxide. The resulting shallow trench isolates the emitter and base polysilicon regions. A boron doped "link" is formed by a low energy implant into the trench. The trench is then refilled with CVD oxide and anisotropically etched back to expose the emitter. An emitter arsenic implant follows.

Figure 3A:
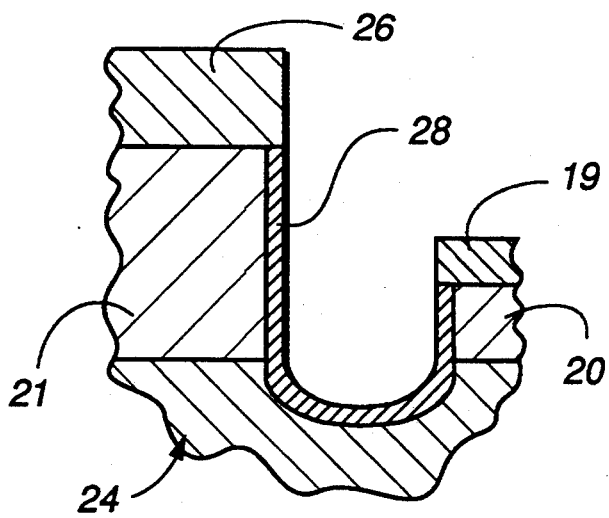
FIGS. 3a-3c provide a schematic cross section of a portion of a bipolar transistor showing a process flow for fabricating an intrinsic-extrinsic base link in a bipolar transistor according to the present invention.
Figure 3B:
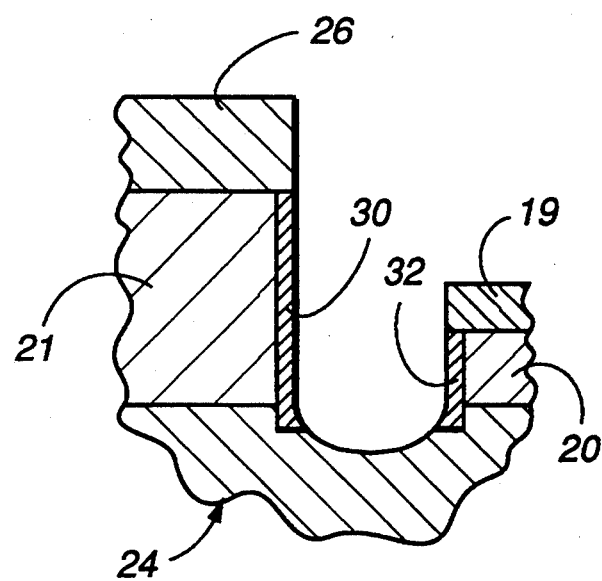
Figure 3C:
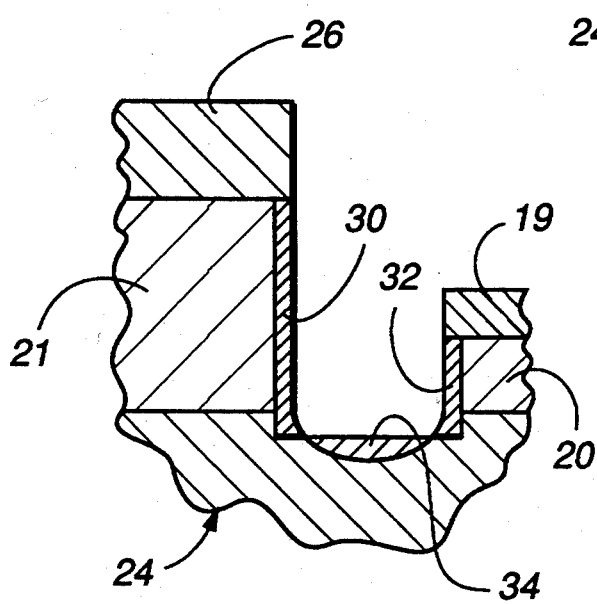

The following discussion is best understood with reference to FIGS. 3a–3c, which provide a schematic cross section of a portion of a bipolar transistor showing a process flow for fabricating an intrinsic-extrinsic base link in a bipolar transistor according to the present invention. After emitter etch in accordance with the STRIPE process outlined above, the polysilicon emitter 20 is physically separated from the extrinsic base polysilicon 21. The structure is overetched into single crystal silicon to separate the active (intrinsic) base from the diffused portion of the extrinsic base. A thin oxide 28 (FIG. 3a) is grown on the exposed silicon and polysilicon to provide a low leakage emitter-base junction. In the preferred embodiment of the invention, the electrical emitter-base junction intersects the STRIPE trench 200–400 Å below the polysilicon-silicon interface.

A directional reactive ion etch is used to clear the oxide from the bottom of the trench, while leaving an insulating oxide 30/32 on the sidewalls of the trench (FIG. 3b). This step protects the emitter-base junction by preventing silicon deposition or boron out-diffusion during following processing steps. After reactive ion etching, the device is annealed in a hydrogen gas ambient for about 1 minute at about 900° C. to remove native oxide from all surfaces.

A heavily boron doped layer (e.g. boron concentration of about $1-5 * 10^{18}$ atoms/cm$^3$) of silicon 34 is deposited on the exposed STRIPE trench bottom (FIG. 3c). For this step, the boron doped silicon layer could contain crystalline imperfections without affecting device quality. Some of the boron out-diffuses during subsequent processing (typically emitter rapid thermal anneal) yielding a structure having a shallow diffused link in parallel with a p+ polysilicon link.

The present invention has been described with regard to a single polysilicon structure. The present invention is applied to other structures, such as a double polysilicon structure, in a similar manner. That is, a shallow selective epitaxial link is provided between an intrinsic base region and an extrinsic base region of the device.

The process herein described, through the use of a selective epitaxial link, allows scaling the link portion of the device as the rest of the device is scaled to smaller and smaller sizes to improve device speed. The present state of high speed bipolar transistor technology is such that the link structure of the present invention provides a significant improvement in device speed. Prior art approaches do not provide a link that is scalable to smaller and/or thinner link regions and such approaches are therefore an impediment to the production of faster devices.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. In a bipolar transistor, including a base structure having an intrinsic base region and an extrinsic base region contiguous therewith, wherein said transistor is formed as a part of an integrated circuit having a trench, including sidewalls, the trench separating the intrinsic base and extrinsic base regions of the transistor, said base including a scalable link between said intrinsic base region and said extrinsic base region, comprising:

a thin selective epitaxial layer comprising a heavily boron doped layer of silicon having a boron concentration of about $1-5 * 10^{18}$ atoms/cm$^3$ deposited in a region between said intrinsic base region and said extrinsic base region, traversing at least a portion of said intrinsic base region and extending into said extrinsic base region, said selective epitaxial layer providing a low resistance electrical connection between the intrinsic base region and the extrinsic base region to shunt a residual high resistance path between said intrinsic base and said extrinsic base; and an oxide coating on a vertical portion of a trench wall into which said boron doped silicon has been deposited, said oxide adapted to prevent lateral boron out-diffusion or electrical conduction through the trench sidewalls.

2. In a bipolar transistor having a collector, an emitter, and a base structure, said base structure including a shallow intrinsic base region and a contiguous shallow extrinsic base region, a shallow link forming a low resistance electrical connection between said intrinsic base region and said extrinsic base region to shunt a residual high resistance path between said intrinsic base and said extrinsic base, wherein said transistor is formed as a part of an integrated circuit having a trench including sidewalls, the trench separating the intrinsic base and extrinsic base regions of the transistor, the intrinsic base region including a polysilicon emitter layer and a diffused base layer, and said extrinsic base region including a polysilicon base layer and a diffused base layer, the shallow link providing a low resistance electrical coupling between said intrinsic base polysilicon emitter layer and said extrinsic base polysilicon layer, comprising:

a thin layer of selective epitaxial silicon comprising a heavily boron doped layer of silicon having a boron concentration of about $1-5 * 10^{18}$ atoms/cm$^3$ deposited within said trench in a region between said intrinsic base region and said extrinsic base region, traversing at least a portion of said intrinsic base region and extending into said extrinsic base region, said selective epitaxial layer comprising a heavily boron doped layer of silicon deposited in a region between said intrinsic base region and said extrinsic base region; and an oxide coating on a vertical portion of a trench wall into which said boron doped silicon has been deposited, such that said oxide prevents lateral boron out-diffusion or electrical conduction through the trench sidewalls.

3. The transistor of claim 2, further comprising:
an emitter structure having self aligned contacts, said base having an extrinsic base contact formed from a first layer of polysilicon, and said emitter having an emitter contact formed from a second layer of polysilicon.

4. The transistor of claim 2, further comprising:
an emitter structure having self aligned contacts, said base having an extrinsic base contact and said emitter having an emitter contact, both contacts formed from a single layer of polysilicon.

* * * * *